United States Patent
Siepchen et al.

(10) Patent No.: US 9,640,678 B2
(45) Date of Patent: May 2, 2017

(54) METHOD FOR PRODUCING THE REAR CONTACT LAYER FOR CDTE THIN-FILM SOLAR CELLS

(71) Applicants: China Triumph International Engineering Co., Ltd., Shanghai (CN); CTF Solar GmbH, Dresden (DE)

(72) Inventors: Bastian Siepchen, Dresden (DE); Bettina Späth, Dresden (DE); Shou Peng, Shanghai (CN)

(73) Assignees: China Triumph International Engineering Co., Ltd., Shanghai (CN); CTF Solar GmbH, Dresden (DE)

( * ) Notice: Subject to any disclaimer, the term of this patent is extended or adjusted under 35 U.S.C. 154(b) by 0 days.

(21) Appl. No.: 15/024,859

(22) PCT Filed: Jul. 16, 2014

(86) PCT No.: PCT/EP2014/065251
§ 371 (c)(1),
(2) Date: Mar. 25, 2016

(87) PCT Pub. No.: WO2015/043794
PCT Pub. Date: Apr. 2, 2015

(65) Prior Publication Data
US 2016/0260853 A1    Sep. 8, 2016

(30) Foreign Application Priority Data

Sep. 26, 2013    (CN) .......................... 2013 1 0446479

(51) Int. Cl.
*H01L 31/0224* (2006.01)
*C23C 14/02* (2006.01)
(Continued)

(52) U.S. Cl.
CPC .... *H01L 31/022441* (2013.01); *C23C 14/021* (2013.01); *C23C 14/0629* (2013.01);
(Continued)

(58) Field of Classification Search
CPC ......... H01L 31/022441; H01L 31/1828; H01L 31/1864; C23C 14/021; C23C 14/14; C23C 14/34; C23C 14/5806
See application file for complete search history.

(56) References Cited

U.S. PATENT DOCUMENTS

| 5,028,296 | A | * | 7/1991 | Tregilgas | ................ | C30B 33/00 257/E21.497 |
| 7,211,462 | B2 | * | 5/2007 | Romeo | ............... | C23C 14/0629 257/184 |

(Continued)

OTHER PUBLICATIONS

Yan Y et al.: "Microstructure of CdTe thin films after mixed nitric and phosphoric acids etching and (HgTe, CuTe)-graphite pasting", Thin Solid Films, Elsevier-Sequoia S.A. Lausanne, CH, vol. 472, No. 1-2, Jan. 24, 2005 (Jan. 24, 2005), pp. 291-296, XP027864933, ISSN: 0040-6090, paragraphs [0002], [0003]; paragraphs [03.1], [0004].

(Continued)

*Primary Examiner* — Savitr Mulpuri
(74) *Attorney, Agent, or Firm* — Michael Soderman

(57) ABSTRACT

The present invention concerns a method for the manufacture of the first layer of a back contact layer for thin-layer solar cells in superstrate configuration. In the prior art, this layer is deposited as a compound, for example as a layer of $Sb_2Te_3$. In accordance with the invention, however, a tellurium-rich surface layer of the cadmium telluride layer is produced, on which a first material is deposited which is capable of forming an electrically conductive second material with tellurium and of producing the second material by (Continued)

reaction of the first material and tellurium in the surface layer. The second material forms the first layer of the back contact layer.

18 Claims, 2 Drawing Sheets

(51) Int. Cl.
    *C23C 14/06*     (2006.01)
    *C23C 14/18*     (2006.01)
    *H01L 31/18*     (2006.01)
    *C23C 14/14*     (2006.01)
    *C23C 14/34*     (2006.01)
    *C23C 14/58*     (2006.01)

(52) U.S. Cl.
    CPC ............ *C23C 14/14* (2013.01); *C23C 14/185* (2013.01); *C23C 14/34* (2013.01); *C23C 14/5806* (2013.01); *H01L 31/1828* (2013.01); *H01L 31/1864* (2013.01)

(56) References Cited

U.S. PATENT DOCUMENTS

| | | | | |
|---|---|---|---|---|
| 8,044,477 | B1* | 10/2011 | Zhong | C23C 14/0036 136/260 |
| 8,298,856 | B2* | 10/2012 | Garnett | H01L 31/02966 257/13 |
| 8,748,214 | B2* | 6/2014 | DeLuca | H01L 31/02963 257/E21.07 |
| 9,276,157 | B2* | 3/2016 | Foust | H01L 21/02052 |
| 9,287,439 | B1* | 3/2016 | Drost | H01L 21/02422 |
| 2011/0143489 | A1* | 6/2011 | Korevaar | H01L 21/02557 438/84 |
| 2011/0284065 | A1* | 11/2011 | Basol | H01L 29/45 136/256 |
| 2011/0315220 | A1* | 12/2011 | Korevaar | H01L 31/022425 136/258 |
| 2012/0192948 | A1 | 8/2012 | Basol | |
| 2014/0227826 | A1* | 8/2014 | Foust | H01L 31/1828 438/95 |
| 2014/0273334 | A1* | 9/2014 | Christensen | H01L 31/022425 438/94 |

OTHER PUBLICATIONS

Batzner D L et al.: "A study of the back contacts on CdTe/CdS solar cells", Thin Solid Films, Elsevier-Sequoia S.A. Lausanne, CH, vol. 361-362, No. 1, Feb. 1, 2000 (Feb. 1, 2000), pp. 463-467, XP004187520, ISSN: 0040-6090, DOI: 10.1016/S0040-6090 (99) 00842-1, paragraphs [0002], [03.2]; paragraph [0004].

Anke E Abken: "Electrodepositation of $Sb_xTe_y$ layers and chemical stability of $Mo/SB_2Te_3$ systems", Journal of Materials Science Letters, Kluwer Academic Publishers, BO, vol. 21, No. 11, Jun. 1, 2002 (Jun. 1, 2002), pp. 845-847, XP019249112, ISSN: 1573-4811, p. 845; Figure 1; p. 846, left-hand column.

Baetzner D L et al.: "Effect of Back Contact Metallization on the Stability of CdTe/CdS Solar Cells", 16th E.C. Photovoltaic Solar Energy Conference. Glascow, United Kingdom, May 1-5, 2000 [Proceedings of the International Photovoltaic Solar Energy Conference], London: James & James Ltd, GB, vol. CONF. 16, May 1, 2000 (May 1, 2000), pp. 353-356, XP001138312, ISBN: 978-1-902916-18-7, paragraph [0002]; Figure 2; Table 1.

Proskuryakov Y et al.: "Admittance spectroscopy of CdTe/CdS solar cells subjected to vaned nitric-phosphoric etching conditions", Journal of Applied Physics, American Institute of Physics, US, vol. 101, No. 1, Jan. 9, 2007 (Jan. 9, 2007), pp. 14505-014505, XP012096813, ISSN: 0021-8979, DOI: 10.1063/1.2402961, the whole document.

\* cited by examiner

METHOD FOR PRODUCING THE REAR CONTACT LAYER FOR CDTE THIN-FILM SOLAR CELLS

CROSS REFERENCE TO RELATED APPLICATIONS

This application is the U.S. national stage of International Application No. PCT/EP2014/065251, filed on Jul. 16, 2014, and claims the priority thereof. The international application claims the priority of Chinese Application No. CN 201310446479.7 filed on Sep. 26, 2013; all applications are incorporated by reference herein in their entirety.

BACKGROUND

The present invention relates to a method for improving the back contact layer, or more precisely the back contact sequence of layers for CdTe thin-layer solar cells.

In the prior art, CdTe thin-layer solar cells in the superstrate configuration are produced by applying a transparent front contact layer (TCO—transparent conductive oxide) to a substrate (preferably glass). A layer of cadmium sulphide (CdS) is deposited on it and a layer of cadmium telluride (CdTe) is applied over it. The back contact layer or back contact sequence of layers is in turn deposited on the CdTe.

The problem in this case is that it is not possible to apply a metallic contact layer directly onto the CdTe, because this could give rise to the formation of a rectifying Schottky contact. However, the formation of an ohmic contact is what is wanted. The intention of the sequence of layers is to equalize the energy levels of the individual layer materials in a manner such as to form an ohmic contact, wherein the uppermost back contact layer is preferably a metallic layer.

During the manufacturing process, activation of the CdTe by means of $CdCl_2$ and heating are preferably carried out after application of the CdTe.

In prior art methods, the cadmium telluride layer then undergoes a wet chemical etch. To this end, the CdTe solar cell is immersed in a so-called NP etch. The NP etch is an aqueous solution of various inorganic acids, preferably $HNO_3$ (0.5%-5%)/$H_3PO_4$ (50%-85%)/$H_2O$ (15%-45%) (total 100%). This is carried out within a temperature range from ambient temperature (18° C.) to approximately 80° C. The etching period is preferably in the range 5 s to 60 s. As a result of NP etching, a Te-rich layer is formed which has a thickness in the range 1 nm to 300 nm.

Alternatively, bromomethanol is used as the etching agent. The concentration in this case is preferably in the range 0.1%-5% $Br_2$, particularly preferably in the range 0.5%-1%. During the etching procedure (etching period 3 s to 30 s), a temperature of 15° C. to 50° C., particularly preferably 20° C. to 35° C. and more particularly preferably 21° C. to 30° C. is maintained. The thickness obtained for the Te-rich layer is in the range 1 nm to 30 nm.

The etching step cleans oxides, inter alia, which are formed during the course of the manufacturing process upon contact with the atmosphere, off the surface. Optional additional treatments with reducing solutions may be necessary for this purpose in order to remove the oxides from the Te layer as comprehensively as possible.

Subsequently, in prior art processes, a layer of $Sb_2Te_3$ is often applied, preferably by sputtering of $Sb_2Te_3$. Next, further plies of the back contact sequence of layers, typically of molybdenum and nickel, are applied. A corresponding process has been described, for example, in U.S. Pat. No. 7,211,462 B1, which dispenses with an etching step and only carries out a $CdCl_2$ treatment of the surface. The $Sb_2Te_3$ layer is applied by sputtering in this case. Other known methods for applying the $Sb_2Te_3$ layer are vapour deposition or electrolytic deposition. If necessary, a plurality of $Sb_2Te_3$ layers may also be provided.

Depositing the $Sb_2Te_3$ layer is highly cost-intensive, since $Sb_2Te_3$ is very expensive.

Thus, there is a need for the $Sb_2Te_3$ layer to be produced in an alternative manner or to replace it with other materials.

This need is fulfilled by the method in accordance with the invention as claimed in claim 1. Advantageous embodiments are disclosed in the dependent claims.

SUMMARY

The present invention concerns a method for the manufacture of the first layer of a back contact layer for thin-layer solar cells in superstrate configuration. In the prior art, this layer is deposited as a compound, for example as a layer of $Sb_2Te_3$. In accordance with the invention, however, a tellurium-rich surface layer of the cadmium telluride layer is produced, on which a first material is deposited which is capable of forming an electrically conductive second material with tellurium and of producing the second material by reaction of the first material and tellurium in the surface layer. The second material forms the first layer of the back contact layer.

DETAILED DESCRIPTION

In accordance with the invention, the need is fulfilled by means of a first back contact layer such as the $Sb_2Te_3$ layer, for example, which is no longer produced by applying the first back contact layer directly, but by producing it from its components, wherein a tellurium-rich surface layer of the CdTe layer is employed.

Investigations have shown that during the course of activation of the CdTe with $CdCl_2$, oxides are generated on the surface. The subsequent etching step and other further, optional treatments result in removal of the surface oxides and liberation of the cadmium from the CdTe layer. A particularly tellurium-rich surface layer of the CdTe layer is left behind.

This surface layer, which is already rich with tellurium, preferably has a thickness of 1 nm to 300 nm, particularly preferably 10 nm to 150 nm. The first back contact layer is furthermore produced such that a first material, for example antimony, is added to this surface layer, so that the required layer can be formed from the second material, for example the layer of $Sb_2Te_3$.

Other materials which form an electrically conductive compound with tellurium—i.e. the second material, may be used instead of antimony as the first material. Preferably, they are zinc (Zn), arsenic (As) or mercury (Hg).

The first material may be added using prior art methods which are suitable for the respective first material. Thus, for example, sputtering and vapour deposition are particularly suitable procedures. Electrochemical or wet chemical deposition is also suitable. Furthermore, methods which are similar to the method of U.S. Pat. No. 5,124,278 are also suitable, in which the first material is added using special CVD (chemical vapour deposition) methods, i.e. MOCVD (metal-organic chemical vapour deposition) or OMVPE (organometallic vapour phase epitaxy). The starting materials here are organometallic compounds. Thermal decomposition of an organometallic compound onto the Te-rich surface is also possible.

When applying the first material to the Te-rich surface layer, a layer of the first material is formed, in particular during the dry process. Depending on the selected method, a heat treatment step may be necessary in order to carry out the subsequent formation of the first back contact layer. The subsequent vacuum heat treatment is preferably carried out in the temperature range of 50° C.-300° C. for 1 min-30 min, particularly preferably in the range 130° C.-170° C. for 8 min-10 min. Experience has shown that the optimum is approximately 150° C. for approximately 10 min. However, this may differ, depending on the first material, the method employed for applying the first material and other process parameters.

Preferably, the following method is used to apply the first material:

sputtering: substrate temperature 20° C.-300° C., layer thickness obtained 10 nm-150 nm vapour deposition: substrate temperature 20° C.-300° C., layer thickness obtained 10 nm-150 nm wet chemical deposition: substrate temperature 20° C.-100° C., layer thickness obtained 10 nm-150 nm MOCVD or OMVPE from organometallic compounds in similar manner to U.S. Pat. No. 5,124,278 decomposition of organometallic compounds on the Te-rich layer at 520° C. to 550° C., layer thickness obtained 10 nm-150 nm.

Preferably, the thicknesses of the individual layer are in the following ranges: Te 20 nm-150 nm, first material 10 nm-150 nm, particularly preferably: Te 40 nm-100 nm, first material 20 nm-100 nm, and more particularly preferably: Te 55 nm-60 nm, first material 40 nm-60 nm. In this regard, the individual layer thicknesses correspond to the stoichiometric ratio of the first material to Te to be set in the second material. For zinc telluride (ZnTe) and mercury telluride (HgTe), this is preferably a ratio of 1:1, while for arsenic telluride ($As_2Te_3$) and antimony telluride ($Sb_2Te_3$), it is preferably a ratio of 2:3.

After producing the first back contact layer, the further layers of the back contact sequence of layers are applied as described in the prior art. Preferably, in this case they are preferably molybdenum and Ni:V layers which can be sputtered, for example.

The method in accordance with the invention therefore produces the first back contact layer as a base layer for the back contact layer stack from the first material and Te, without having to provide the expensive second material, for example $Sb_2Te_3$, in the form of a compound.

BRIEF DESCRIPTION OF THE DRAWINGS

FIG. 1 shows the prepared solar cells with the substrate (1) onto which the transparent front contact (21) as well as the CdS layer (3) and over it the CdTe layer (4) have already been applied.

FIG. 2 diagrammatically shows the etching process using an NP etch (6).

Figure 3:

After the etching process, as can be seen in FIG. 3, a Te-rich layer (41) remains, from which the majority of the Cd has been liberated.

Figure 4:
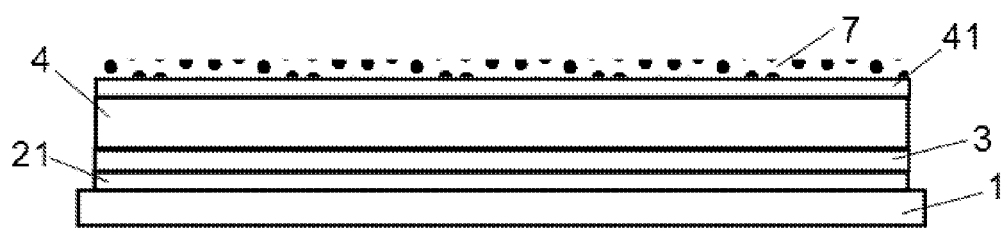

FIG. 4 diagrammatically shows that a layer of Sb has been disposed over the Te-rich layer (41).

Figure 5:
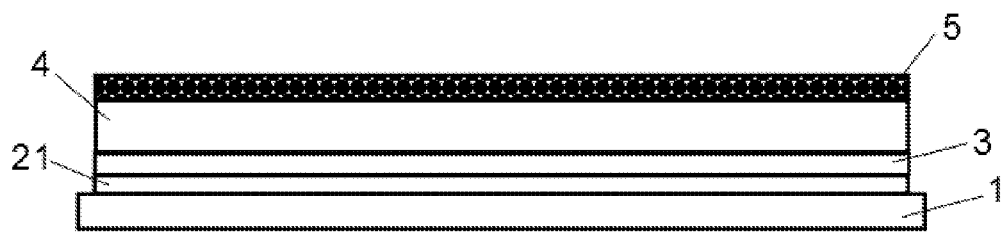

As can be seen in diagrammatic form in FIG. 5, the Te-rich layer (41) and the Sb layer (7) react under the action of heat to form a $Sb_2Te_3$ layer (5).

Figure 6:
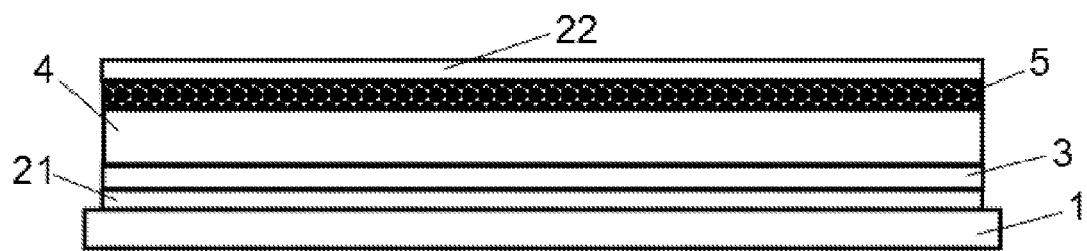

FIG. 6 diagrammatically shows the sequence of layers of the prepared solar cell after application of the back contact (22) to the $Sb_2Te_3$ layer (5). The back contact layer (22) can in this case be configured as a sequence of layers.

DETAILED DESCRIPTION OF THE PREFERRED EMBODIMENTS

The process of the invention will now be illustrated by means of two exemplary embodiments, which are in no way limiting in nature.

Figure 1:
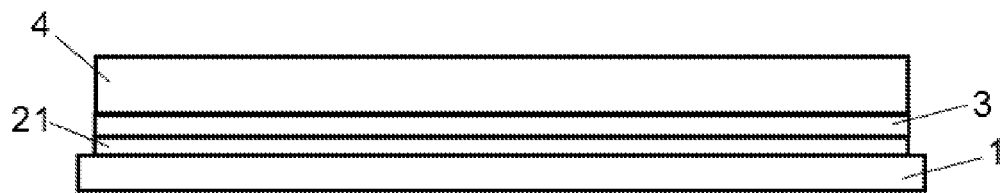
FIG. 1 to FIG. 5 diagrammatically show the sequence of the process steps in accordance with the invention for a first embodiment in which a $Sb_2Te_3$ layer is produced as the first back contact layer.
Figure 2:
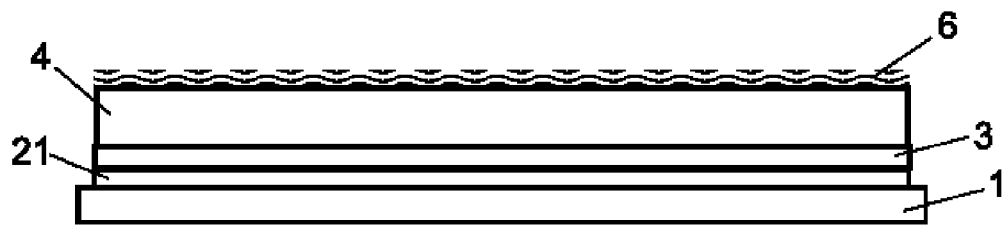

In accordance with a first embodiment, after applying the front contact layer (21), the CdS layer (3) and the CdTe layer (4) to the glass substrate (1) (FIG. 1), the CdTe surface layer is activated, in accordance with the prior art, using $CdCl_2$ at 400° C. Next, the NP etching step (FIG. 2) is carried out with a NP etch solution (6): $HNO_3$ (1%)/$H_3PO_4$(77%)/$H_2O$ (22%), at a temperature of 20° C. A Te-rich layer (41) is formed with a layer thickness of 150 nm (FIG. 3). The cadmium in this layer is only present in substantially sub-stoichiometric quantities.

Next, a 45 nm thick layer of Sb (7) is sputtered onto the Te-rich layer (41) at a substrate temperature of 150° C. (FIG. 4).

Next, the whole sequence of layers is heated up again for a period of 12 min at 150° C. in a vacuum in order to promote the formation of the $Sb_2Te_3$ compound (5). The resulting thickness of the $Sb_2Te_3$ layer is 90 nm (FIG. 5).

Subsequently, the back contact layer (22) is deposited, which back contact layer consists of a sequence of layers formed by a molybdenum layer and a nickel layer with added vanadium. The molybdenum layer (150 nm) is deposited on the $Sb_2Te_3$ layer by sputtering. Next, another layer of nickel with added vanadium is deposited on the molybdenum layer (sputtering, 150 nm).

Alternatively, in a second exemplary embodiment, subsequent to producing the Te-rich layer (41), a 35 nm thick layer of Zn is sputtered onto the Te-rich layer (41) instead of the Sb layer (7) and a subsequent heat treatment is carried out using the same parameters as described in the first exemplary embodiment to produce a 70 nm thick ZnTe layer instead of the $Sb_2Te_3$ layer (5). Subsequently, the back contact layer (22) is deposited as described in the first exemplary embodiment.

LIST OF REFERENCE NUMERALS 1 substrate (glass)
21 front contact (transparent, TCO)
22 back contact (metal)
3 CdS layer
4 CdTe layer
41 Te-rich layer after etching
5 $Sb_2Te_3$ layer
6 NP etching
7 sputtered Sb layer

The invention claimed is:

1. A method for the manufacture of a back contact layer for CdTe thin-layer solar cells in superstrate configuration, characterized in that a first back contact layer is produced by means of the following steps:

producing a tellurium-rich surface layer of the cadmium telluride layer, depositing a layer of an elemental first material consisting solely of antimony on the tellurium-rich surface layer, and producing a first back contact layer via reaction of the first material and tellurium in the surface layer to create $Sb_2Te_3$.

2. The method as claimed in claim 1, characterized in that the tellurium-rich surface layer is produced by means of a NP etch step or a bromomethanol etching step.

3. The method as claimed in claim 2, characterized in that the formation of a tellurium-rich surface layer is promoted by heating the substrate during the etching step.

4. The method as claimed in claim 1, characterized in that the first material is applied to the tellurium-rich surface layer by sputtering, vapour deposition, electrochemical or wet chemical deposition, or by a CVD method.

5. The method as claimed in claim 1, characterized in that, after depositing the first material onto the tellurium-rich surface layer, the formation of the first back contact layer is promoted by heating the substrate.

6. The method as claimed in claim 5, characterized in that heating of the substrate is carried out at 50° C.-300° C. for 1 min-30 min.

7. A method for the manufacture of a back contact layer for CdTe thin-layer solar cells in superstrate configuration, characterized in that a first back contact layer is produced by means of the following steps:

producing a tellurium-rich surface layer of the cadmium telluride layer, depositing a layer of an elemental first material consisting solely of arsenic on the tellurium-rich surface layer, and producing a first back contact layer via reaction of the first material and tellurium in the surface layer to create $As_2Te_3$.

8. The method as claimed in claim 7, characterized in that the tellurium-rich surface layer is produced by means of a NP etch step or a bromomethanol etching step.

9. The method as claimed in claim 8, characterized in that the formation of a tellurium-rich surface layer is promoted by heating the substrate during the etching step.

10. The method as claimed in claim 7, characterized in that the first material is applied to the tellurium-rich surface layer by sputtering, vapour deposition, electrochemical or wet chemical deposition, or by a CVD method.

11. The method as claimed in claim 7, characterized in that, after depositing the first material onto the tellurium-rich surface layer, the formation of the first back contact layer is promoted by heating the substrate.

12. The method as claimed in claim 11, characterized in that heating of the substrate is carried out at 50° C.-300° C. for 1 min-30 min.

13. A method for the manufacture of a back contact layer for CdTe thin-layer solar cells in superstrate configuration, characterized in that a first back contact layer is produced by means of the following steps:

producing a tellurium-rich surface layer of the cadmium telluride layer, depositing a layer of an elemental first material consisting solely of mercury on the tellurium-rich surface layer, and producing a first back contact layer via reaction of the first material and tellurium in the surface layer to create HgTe.

14. The method as claimed in claim 13, characterized in that the tellurium-rich surface layer is produced by means of a NP etch step or a bromomethanol etching step.

15. The method as claimed in claim 14, characterized in that the formation of a tellurium-rich surface layer is promoted by heating the substrate during the etching step.

16. The method as claimed in claim 13, characterized in that the first material is applied to the tellurium-rich surface layer by sputtering, vapour deposition, electrochemical or wet chemical deposition, or by a CVD method.

17. The method as claimed in claim 13, characterized in that, after depositing the first material onto the tellurium-rich surface layer, the formation of the first back contact layer is promoted by heating the substrate.

18. The method as claimed in claim 17, characterized in that heating of the substrate is carried out at 50° C.-300° C. for 1 min-30 min.

* * * * *